(12) United States Patent
Wehlus et al.

(10) Patent No.: US 10,141,535 B2
(45) Date of Patent: Nov. 27, 2018

(54) OPTOELECTRONIC COMPONENT AND A METHOD FOR PRODUCING AN OPTOELECTRONIC COMPONENT

(71) Applicant: OSRAM OLED GmbH, Regensburg (DE)

(72) Inventors: Thomas Wehlus, Lappersdorf (DE); Johannes Rosenberger, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/326,503

(22) PCT Filed: Jul. 16, 2015

(86) PCT No.: PCT/EP2015/066306
§ 371 (c)(1),
(2) Date: Jan. 16, 2017

(87) PCT Pub. No.: WO2016/008994
PCT Pub. Date: Jan. 21, 2016

(65) Prior Publication Data
US 2017/0213995 A1    Jul. 27, 2017

(30) Foreign Application Priority Data
Jul. 17, 2014    (DE) .................. 10 2014 110 052

(51) Int. Cl.
*H01L 51/52*    (2006.01)
*H01L 51/44*    (2006.01)
(Continued)

(52) U.S. Cl.
CPC ........ *H01L 51/5228* (2013.01); *H01L 51/441* (2013.01); *H01L 51/5212* (2013.01);
(Continued)

(58) Field of Classification Search
CPC ............ H01L 51/5228; H01L 51/5212; H01L 51/441; H01L 51/56
See application file for complete search history.

(56) References Cited

U.S. PATENT DOCUMENTS

2007/0273276 A1    11/2007    Ottermann et al.
2010/0090207 A1    4/2010    Klein et al.
2015/0084006 A1    3/2015    Ivanov

FOREIGN PATENT DOCUMENTS

CN    102064285 A    5/2011
DE    102004013449 B3    12/2005
(Continued)

OTHER PUBLICATIONS

International Search Report based on Application No. PCT/EP2015/066306 (3 pages + 2 pages English translation) dated Oct. 8, 2015.
(Continued)

*Primary Examiner* — Douglas Menz
(74) *Attorney, Agent, or Firm* — Viering, Jentschura & Partner MBB

(57) ABSTRACT

An optoelectronic component may include a first electrode having one outer electrode segment formed at a lateral edge of the first electrode, and one inner electrode segment formed apart from the lateral edge of the first electrode, an electrically conductive current distribution structure formed above the first electrode and having one outer substructure extending over the outer electrode segment, and one inner substructure extending over the inner electrode segment and electrically insulated from the outer substructure, one current lead extending from the lateral edge of the first electrode toward the inner substructure, electrically coupled to the inner substructure, electrically insulated from the outer substructure and which structure corresponds to the current distribution structure, an insulation structure, which covers the current distribution structure and the current lead, an
(Continued)

organic functional layer structure, and a second electrode above the organic functional layer structure.

15 Claims, 5 Drawing Sheets

(51) Int. Cl.
  *H01L 51/56* (2006.01)
  *H01L 27/32* (2006.01)
(52) U.S. Cl.
  CPC .......... *H01L 51/56* (2013.01); *H01L 27/3237* (2013.01); *H01L 2251/5361* (2013.01); *Y02E 10/549* (2013.01)

(56) References Cited

FOREIGN PATENT DOCUMENTS

| | | | |
|---|---|---|---|
| DE | 102006030536 B3 | 2/2008 |
| DE | 102011017383 A1 | 10/2012 |
| EP | 2698836 A1 | 2/2014 |
| WO | 2004107467 A2 | 12/2004 |
| WO | 2013114295 A1 | 8/2013 |

OTHER PUBLICATIONS

German Search Report based on Application No. 10 2014 110 052.2 (10 pages) dated Jul. 14, 2015.
Chinese Office Action based on application No. 201580038737.5 (8 pages and 5 pages of English translation) dated Jun. 4, 2018.

OPTOELECTRONIC COMPONENT AND A METHOD FOR PRODUCING AN OPTOELECTRONIC COMPONENT

RELATED APPLICATIONS

The present application is a national stage entry according to 35 U.S.C. § 371 of PCT application No.: PCT/EP2015/066306 filed on Jul. 16, 2015, which claims priority from German application No.: 10 2014 110 052.2 filed on Jul. 17, 2014, and is incorporated herein by reference in its entirety.

TECHNICAL FIELD

Various embodiments generally relate to an optoelectronic component and to a method for producing an optoelectronic component.

BACKGROUND

An optoelectronic component emits or absorbs light. The optoelectronic component is for example a light emitting diode, for example an organic light emitting diode (OLED), a photodetector or a solar cell. An OLED includes an anode and a cathode with an organic functional layer system therebetween. The organic functional layer system may include one or a plurality of emitter layers in which electromagnetic radiation is generated, a charge generating layer structure composed of respectively two or more charge generating layers (CGL) for charge generation, and one or a plurality of electron blocking layers, also designated as hole transport layer(s) (HTL), and one or a plurality of hole blocking layers, also designated as electron transport layer(s) (ETL), in order to direct the current flow.

In OLED development there is currently a discernible trend toward segmented luminous areas. An OLED can be segmented and therefore may include a plurality of OLED elements. The OLED elements can for example be electrically connected in parallel and/or share at least one common electrode. By way of example, two OLED elements include the same cathode, but have organic functional layer structures separated from one another and anodes correspondingly separated from one another. In this case, the OLED elements can be driven and used as a uniform luminous area. However, the OLED elements can also be functionally independent of one another and/or be driven independently of one another. One difficulty here consists in driving inner OLED elements without current leads to said inner OLED elements disturbing the luminous image and/or the appearance of the outer luminous areas. Hitherto, inner luminous regions which are represented by means of inner OLED elements and are intended to be luminous independently of outer luminous regions have been led as far as the edge at at least one location. Self-contained inner luminous areas have only been possible hitherto if there is no longer any further luminous areas situated outside the corresponding luminous area.

In the region of a continuous luminous area it is known, in the case of one of the electrodes, to form an electrically conductive current distribution structure which extends like a net over the corresponding luminous area and contributes to a uniform distribution of the electric current. The current distribution structure may include for example a plurality of rectilinear current conducting sections which are integrally connected and form predefined angles with one another. By way of example, a current distribution structure is known which includes a structure consisting of hexagons, for example regular hexagons, wherein the sides of the hexagons represent the current conducting sections and the angles formed may be for example 120° in each case. The current distribution structure can also be designated as a busbar structure, and the current conducting sections can also be designated as busbars.

SUMMARY

Various embodiments provide an optoelectronic component including one or a plurality of inner functional areas, for example emission areas or absorption areas, which do not touch a lateral edge of the optoelectronic component, are spaced apart therefrom and/or are surrounded by outer functional areas which fulfill a desired functionality, for example are luminous, for example are luminous homogeneously, during the operation of the optoelectronic component and/or in the case of which feeding or carrying away current is possible in a simple manner.

Various embodiments further provide a method for producing an optoelectronic component which is implementable in a simple and/or cost-effective manner and/or which enables the optoelectronic component to be provided in such a way that it includes one or a plurality of inner functional areas, for example emission areas or absorption areas, which do not touch a lateral edge of the optoelectronic component, are spaced apart therefrom and/or are surrounded by outer functional areas which fulfill a desired functionality, for example are luminous, for example are luminous homogeneously, during the operation of the optoelectronic component and/or in the case of which feeding or carrying away current is possible in a simple manner.

In accordance with one embodiment of the present disclosure the object is achieved by means of an optoelectronic component including a first electrode including at least one outer electrode segment which is formed at a lateral edge of the first electrode, and at least one inner electrode segment which is formed in a manner spaced apart from the edge of the first electrode. An electrically conductive current distribution structure is formed above the first electrode, said electrically conductive current distribution structure including at least one outer substructure which extends at least over the outer electrode segment, and at least one inner substructure which extends at least over the inner electrode segment and which is electrically insulated from the outer substructure. At least one current lead extends from the lateral edge of the first electrode toward the inner substructure, is electrically coupled to the inner substructure and is electrically insulated from the outer substructure, wherein a structure of the current lead corresponds to the current distribution structure. An insulation structure covers the current distribution structure and the current lead. An organic functional layer structure is formed above the first electrode, the current distribution structure, the current lead and the insulation structure. A second electrode is formed above the organic functional layer structure.

The current lead whose structure corresponds to the current distribution structure enables current to be fed to the inner substructure from the outside or current to be carried away from the inner substructure toward the outside. The fact that the structure of the current lead corresponds to the current distribution structure can contribute to the current lead and the current distribution structure being led to the inner substructure and being concealed below the insulation structure, such that no further structure other than the insulation structure for electrically insulating the current distribution structure is discernible from the outside. The inner substructure is an element of an inner functional area, for example of one or a plurality of OLED elements, of the optoelectronic component and enables the corresponding inner functional area to fulfill the functionality desired of it, for example to be luminous, for example to be luminous homogeneously, during the operation of the optoelectronic component and/or feeding or carrying away current toward or away from the inner functional area to be possible in a simple manner. In particular, by means of the current lead whose structure corresponds to the current distribution structure, different, homogeneously energized, self-contained luminous areas can be defined, without this being visible from the outside.

The current distribution structure is used for distributing the current over two or more functional areas, and the current lead is used for feeding or carrying away current to or from an inner functional area. In this case, current distribution sections belonging to the current distribution structure firstly can be used as a current lead for carrying current. In other words, the busbars are used not only for current distribution but also for conducting current in a targeted manner to luminous areas embodied deep within the component. As an alternative thereto, the current lead can be formed in addition to the current distribution sections, wherein the current lead, on account of its structure, cannot be distinguished from the current conducting sections by a user of the optoelectronic component from the outside.

In accordance with one development, the structure of the current lead is geometrically similar to the current distribution structure. That is to say that the structure of the current lead can be mapped onto the current distribution structure by means of a rotation, mirroring, displacement, expansion and/or compression. By way of example, angles occurring in the current distribution structure correspond to the angles occurring in the current lead, and/or lengths of current conducting sections of the current distribution structure correspond to lengths of current lead sections of the current lead. The geometrical similarity can contribute to the fact that the current lead is not distinguishable from the current distribution structure from the outside and/or the fact that the current lead can be formed in a simple and/or cost-effective manner and/or the fact that the current lead can be formed jointly with the current distribution structure below the insulation structure.

In accordance with one development, the outer substructure is formed in an integral fashion and includes a plurality of rectilinear current distribution sections, wherein the current lead runs adjacent to the current distribution sections. In particular, the current lead sections run adjacent to the current distribution sections. This can contribute in a simple manner to the fact that the structure of the current lead corresponds to the current distribution structure and/or the fact that the current lead is not distinguishable from the current distribution structure from the outside and/or the fact that the current lead can be formed jointly with the current distribution structure below the insulation structure.

In accordance with one development, the current lead runs laterally alongside or above the current distribution sections. In particular, the current lead sections run laterally alongside or above the current distribution sections. This can contribute in a simple manner to the fact that the structure of the current lead corresponds to the current distribution structure and/or the fact that the current lead is not distinguishable from the current distribution structure from the outside and/or the fact that the current lead can be formed jointly with the current distribution structure below the insulation structure.

In accordance with one development, the current lead runs parallel to the current distribution sections. In particular, the current lead sections run parallel to the current distribution sections. This can contribute in a simple manner to the fact that the structure of the current lead corresponds to the current distribution structure and/or the fact that the current lead is not distinguishable from the current distribution structure from the outside and/or the fact that the current lead can be formed jointly with the current distribution structure below the insulation structure.

In accordance with one development, the current lead is formed integrally with the inner substructure. By way of example, the current lead can be formed originally as part of the current distribution structure and then be electrically insulated from the outer substructure. This can contribute to the fact that the current lead can be formed in a simple manner.

In accordance with one development, the outer electrode segment is formed between the lateral edge of the first electrode and the inner electrode segment. This enables an inner functional area including the inner electrode segment to be operated independently of an outer functional area including the outer electrode segment.

In accordance with one development, the inner electrode segment is surrounded in a lateral direction by said one outer electrode segment, a further outer electrode segment and/or a plurality of outer electrode segments. This enables a self-contained inner functional area, that is to say inner functional area spaced apart from the edge in all directions, including the inner electrode segment to be operated independently of an outer functional area including the outer electrode segment.

In accordance with one development, a current distribution section of the current distribution structure and a current lead section—closest thereto—of the current lead are covered by an integral insulation structure section of the insulation structure. In particular, in a sectional view perpendicular to the extension direction of the current distribution section and of the current lead section, the corresponding sectional area of the insulation structure section is formed in an integral fashion. In other words, the insulation structure formed for insulating the current distribution structure is also used for insulating and covering the current lead, wherein the current lead sections run so closely to the current distribution sections that the latter and the former are insulated and covered by the same insulation structure section. This can contribute in a simple manner to the fact that the structure of the current lead corresponds to the current distribution structure and/or the fact that the current lead is not distinguishable from the current distribution structure from the outside.

In accordance with one development, a conducting section of the current distribution structure is covered by a first insulation structure section of the insulation structure and a current lead section—closest thereto—of the current lead is covered by a second insulation structure section of the insulation structure, wherein the first and second insulation structure sections are physically separated from one another. In particular, in a sectional view perpendicular to the extension direction of the current distribution section and of the current lead section, the corresponding sectional area of the insulation structure section is formed in a bipartitate fashion. In other words, a current lead section and an adjacent current distribution section are insulated and covered by two different insulation structure sections, wherein the latter can however be situated so close together that they are perceived by a user from the outside as a single insulation structure section. This can contribute in a simple manner to the fact that the structure of the current lead corresponds to the current distribution structure and/or the fact that the current lead is not distinguishable from the current distribution structure from the outside.

In accordance with a further embodiment, a method for producing an optoelectronic component is provided. In the method, a first electrode is provided, including at least one outer electrode segment which is formed at a lateral edge of the first electrode, and at least one inner electrode segment which is formed in a manner spaced apart from the edge of the first electrode. An electrically conductive current distribution structure is formed above the first electrode, said electrically conductive current distribution structure including at least one outer substructure which extends at least over the outer electrode segment, and at least one inner substructure which extends at least over the inner electrode segment and which is electrically insulated from the outer substructure. At least one current lead is formed which extends from the edge of the outer electrode toward the inner substructure, which is electrically coupled to the inner substructure, which is electrically insulated from the outer substructure and whose structure corresponds to the current distribution structure. An insulation structure is formed above the current distribution structure and the current lead. An organic functional layer structure is formed above the first electrode, the current distribution structure, the current lead and the insulation structure. A second electrode is formed above the organic functional layer structure.

In accordance with one development, the first electrode is firstly formed in an integral fashion and then severed such that the electrode segments are formed. This can contribute in a simple manner to forming the optoelectronic component with the electrode segments in a simple and/or cost-effective manner.

In accordance with one development, the current distribution structure is formed by the current distribution structure firstly being formed in an integral fashion and then being severed such that the substructures are formed. This can contribute in a simple manner to forming the optoelectronic component with the substructures in a simple and/or cost-effective manner.

In accordance with one development, the current lead is formed by the current distribution structure. By way of example, firstly the current distribution structure is formed such that it extends over the entire active region of the optoelectronic component. Afterward, current distribution sections of the current distribution structure are electrically insulated from the rest of the current distribution structure in such a way, for example connections of the current distribution structure are severed in such a way, that substructures and the current lead are formed, wherein the current lead and the inner substructure remain connected to one another and are electrically insulated by the outer substructure. This can contribute in a simple manner to forming the optoelectronic component with the current leads and/or the substructures in a simple and/or cost-effective manner. In particular, the current lead can be formed in a simple and/or cost-effective manner.

In accordance with one development, the current lead is formed in addition to the current distribution structure. This can contribute in a simple manner to the fact that further inner functional areas that are surrounded by other inner functional areas can be formed and/or operated independently.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the accompanying drawings, which form part of this description and show for illustration purposes specific embodiments in which the invention can be implemented. In this regard, direction terminology such as, for instance, "at the top", "at the bottom", "at the front", "at the back", "front", "rear", etc. is used with respect to the orientation of the figure(s) described. Since component parts of embodiments can be positioned in a number of different orientations, the direction terminology serves for illustration and is not restrictive in any way whatsoever. It goes without saying that other embodiments can be used and structural or logical changes can be made, without departing from the scope of protection of the present invention. It goes without saying that the features of the various embodiments described herein can be combined with one another, unless specifically indicated otherwise. Therefore, the following detailed description should not be interpreted in a restrictive sense, and the scope of protection of the present invention is defined by the appended claims.

In the context of this description, the terms "connected" and "coupled" are used to describe both a direct and an indirect connection and a direct or indirect coupling. In the figures, identical or similar elements are provided with identical reference signs, insofar as this is expedient.

An optoelectronic component can be an electromagnetic radiation emitting component or an electromagnetic radiation absorbing component. An electromagnetic radiation absorbing component can be for example a solar cell or a photodetector. In various embodiments, an electromagnetic radiation emitting component can be an electromagnetic radiation emitting semiconductor component and/or can be formed as an electromagnetic radiation emitting diode, as an organic electromagnetic radiation emitting diode, as an electromagnetic radiation emitting transistor or as an organic electromagnetic radiation emitting transistor. The radiation can be light in the visible range, UV light and/or infrared light, for example. In this context, the electromagnetic radiation emitting component can be formed for example as a light emitting diode (LED), as an organic light emitting diode (OLED), as a light emitting transistor or as an organic light emitting transistor. In various embodiments, the light emitting component can be part of an integrated circuit. Furthermore, a plurality of light emitting components can be provided, for example in a manner accommodated in a common housing.

Figure 1:
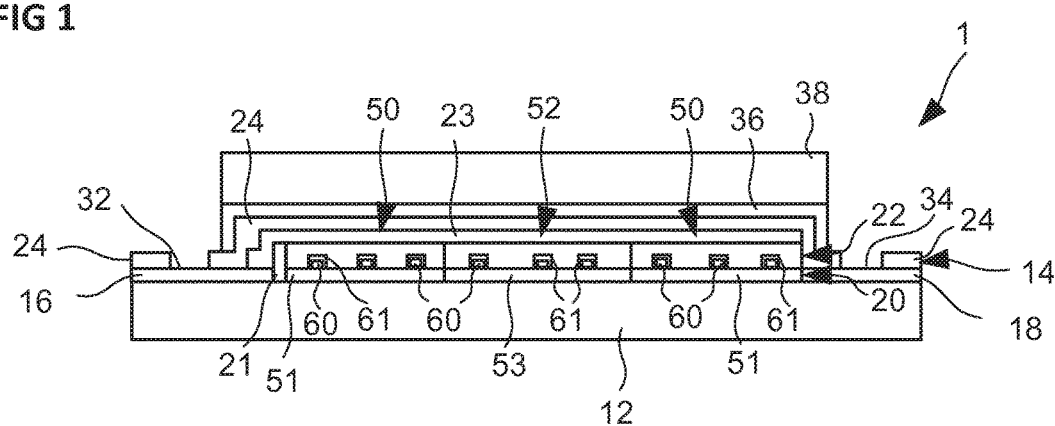
FIG. 1 shows a sectional illustration of one embodiment of an optoelectronic component.

FIG. 1 shows one embodiment of an optoelectronic component 1, in particular an organic light emitting diode (OLED).

The optoelectronic component 1 includes a carrier 12. An optoelectronic layer structure is formed on the carrier 12. The optoelectronic layer structure includes a first electrically conductive layer 14 including a first contact section 16, a second contact section 18 and a first electrode 20. The carrier 12 with the first electrically conductive layer 14 can be designated as a substrate. The second contact section 18 is electrically coupled to the first electrode 20 of the optoelectronic layer structure. The first electrode 20 is electrically insulated from the first contact section 16 by means of an electrical insulation barrier 21. An optically functional layer structure, for example an organic functional layer structure 22, of the optoelectronic layer structure is formed above the first electrode 20. The organic functional layer structure 22 may include for example one, two or more partial layers formed one above another, as explained in greater detail further below with reference to FIG. 13. A second electrically conductive layer, in particular a second electrode 23 of the optoelectronic layer structure, is formed above the organic functional layer structure 22 and is electrically coupled to the first contact section 16.

The first electrode 20 serves for example as an anode or cathode of the optoelectronic layer structure. In a manner corresponding to the first electrode 20, the second electrode 23 serves as a cathode or anode of the optoelectronic layer structure.

The optoelectronic component 1 is segmented and includes an outer segment and an inner segment. The outer segment forms an outer functional area and the inner segment forms an inner functional area. The outer segment is formed by an outer light emitting diode element 50. The inner segment is formed by an inner light emitting diode element 52. The outer light emitting diode element 50 forms a lateral edge of an optically active region of the optoelectronic component 1. The inner light emitting diode element 52 is spaced apart from the lateral edge. The outer light emitting diode element 50 is formed between the inner light emitting diode element 52 and the lateral edge. The light emitting diode elements 50, 52 include mutually separated segments of the organic functional layer structure 22 and mutually separated segments of the first electrode 20. In particular, the first electrode 20 includes an outer electrode segment 51 of the outer light emitting diode element 50 and an inner electrode segment 53 of the inner light emitting diode element 52. If the optoelectronic component 1 includes more or fewer segments, then the first electrode 20 includes correspondingly more or fewer electrode segments 51, 53. The light emitting diode elements 50, 52 share the second electrode 23, which is not segmented. The electrode segments 51, 53 are electrically coupled to different regions (not illustrated) of the second contact section 18, said regions being electrically insulated from one another, such that the light emitting diode elements 50, 52 can be operated independently of one another. The light emitting diode elements 50, 52 are electrically connected in parallel.

An electrically conductive current distribution structure 60 is formed above the first electrode 20. The current distribution structure 60 is formed in direct physical contact with the first electrode 20. The current distribution structure 60 serves for distributing electric current over the optically active region of the optoelectronic component. The current distribution structure 60 can also be designated as a busbar structure.

An insulation structure 61 is formed above the current distribution structure 60. The insulation structure 61 covers the current distribution structure 60 and electrically insulates the latter from the organic functional layer structure 22. The insulation structure 61 is formed in a transparent fashion. Transparent materials can be used for the insulation structure 61, for example photoactive polyimide lacquers, novolac resins, and/or epoxy resins. The transparent materials may be transparent only in some wavelength ranges and non-transparent and/or absorbent in other wavelength ranges. The current distribution structure 60 and the insulation structure 61 are depicted relatively large in relation to the entire optoelectronic component 1 in FIG. 1, for the sake of better illustration. In actual fact the current distribution structure 60 and/or the insulation structure 61 can be formed significantly smaller.

An encapsulation layer 24 of the optoelectronic layer structure is formed above the second electrode 23 and partly above the first contact section 16 and partly above the second contact section 18, said encapsulation layer encapsulating the optoelectronic layer structure. In the encapsulation layer 24, a first cutout of the encapsulation layer 24 is formed above the first contact section 16 and a second cutout of the encapsulation layer 24 is formed above the second contact section 18. A first contact region 32 is exposed in the first cutout of the encapsulation layer 24 and a second contact region 34 is exposed in the second cutout of the encapsulation layer 24.

The first contact region 32 serves for electrically contacting the first contact section 16 and the second contact region 34 serves for electrically contacting the second contact section 18.

An adhesion medium layer 36 is formed above the encapsulation layer 24. A covering body 38 is formed above the adhesion medium layer 36. The adhesion medium layer 36 serves for fixing the covering body 38 to the encapsulation layer 24. The covering body 38 serves for protecting the optoelectronic component 1, for example against mechanical force actions from outside. Furthermore, the covering body 38 can serve for spreading and/or dissipating heat generated in the optoelectronic component 1. The substrate projects laterally below the covering body 38.

Alternatively, the optoelectronic component 1 may include two or more outer light emitting diode elements 50 and corresponding outer electrode segments 51 and/or two or more inner light emitting diode elements 52 and corresponding inner electrode segments 53. The light emitting diode elements 50, 52 can be formed for example such that characters, symbols, numerals, letters or images can be represented with the aid of said light emitting diode elements. Furthermore, inner light emitting diode elements 52 can be formed which are completely surrounded by other inner light emitting diode elements 52. Furthermore, in the case of the light emitting diode elements 50, 52, instead of the first electrode 20 the second electrode 23 can be segmented and/or the first electrode 20 can be formed in a non-segmented fashion and/or in an integral fashion. Furthermore, the light emitting diode elements 50, 52 may include the same organic functional layer structure 22. In other words, the organic functional layer structure 22 can be non-segmented and include no separated segments. By way of example, the organic functional layer structure 22 of light emitting diode elements 50, 52 which are similar with regard to their color and brightness and/or are switched on and off only separately, that is to say independently of one another, may not be separated. By contrast, the segmented organic functional layer structure 22 is preferred if the light emitting diode elements 50, 52 are embodied distinctly differently with regard to their color and/or brightness, for example in the case of a brightness deviation of more than 20%. Furthermore, the insulation structure 61 can be formed in a non-transparent fashion. Furthermore, the substrate and the covering body 38 can be formed such that they are flush or almost flush at their side edges, wherein the contact regions 32, 34 can be contacted for example via cutouts and/or holes in the covering body 38 and/or in the carrier 12. Furthermore, the carrier 12 can be dispensed with and the first electrically conductive layer 14 can be used as a carrier. Furthermore, the covering body 38 can be dispensed with. The optoelectronic component 1 can be formed in a flexible fashion, for example.

Figure 2:
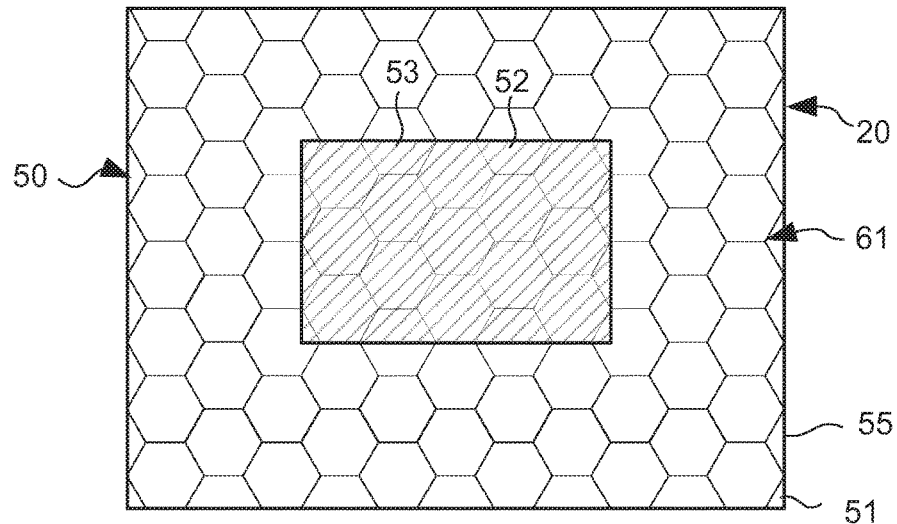
FIG. 2 shows a plan view of an optically active region of one embodiment of an optoelectronic component.

FIG. 2 shows a plan view of an optically active region of one embodiment of an optoelectronic component 1. The optoelectronic component 1 can be formed for example in a manner largely corresponding to the optoelectronic component 1 shown in FIG. 1. The optically active region is the region in which the optoelectronic component 1 emits electromagnetic radiation, for example light. The optically active region is formed in a rectangular fashion in plan view. A lateral edge 55 of the optically active region is formed by the outer light emitting diode element 50 and in particular by the outer electrode segment 51. The inner electrode segment 53 is formed in a rectangular fashion. The inner light emitting diode element 52 and in particular the inner electrode segment 53 are completely surrounded by the outer light emitting diode element 50 and the outer electrode 51. In other words, the outer electrode 51 is formed between the inner electrode 53 and the lateral edge 55.

The insulation structure 61 extends integrally over the entire optically active region of the optoelectronic component 1. The current distribution structure 60, which is covered by the insulation structure 61 in FIG. 2, does not extend integrally over the entire optically active region of the optoelectronic component 1. In particular, the current distribution structure 60 includes substructures that are electrically insulated from one another, as explained in greater detail further below. Moreover, one or a plurality of current leads are also formed below the insulation structure 61, as explained in greater detail further below. Consequently, a user of the optoelectronic component 1 perceives only the insulation structure 61 from the outside, as shown in FIG. 2.

The insulation structure 61 forms a hexagonal lattice including a plurality of regular hexagons. The insulation structure 61 can be formed by or include for example a material that is transparent or at least partly transparent, that is to say transparent in a partial wavelength range. The material may include for example photoactive polyimide lacquers, novolac resins and/or epoxy resins. The structure of the inner light emitting diode element 52 and/or of the inner electrode segment 53 is independent of the insulation structure 61. In other words, the structure of the inner electrode segment 53 and the insulation structure 61 do not correspond to one another.

The outer light emitting diode element 50 forms an outer functional area. The inner light emitting diode element 52 forms an inner functional area, which is illustrated in a hatched fashion in FIG. 2. The outer functional area and the inner functional area serve for emitting electromagnetic radiation, for example light, during the operation of the optoelectronic component 1. The user of the optoelectronic component 1 perceives the inner and/or the outer functional area as luminous area during the operation of the optoelectronic component 1. During the operation of the optoelectronic component 1, the inner functional area can be operated, for example driven and/or regulated, independently of the outer functional area region. By way of example, the optoelectronic component 1 can be driven such that only the inner functional area is luminous or that only the outer functional area is luminous or that both areas are luminous simultaneously or alternately, for example in an alternating or temporally overlapping manner.

Alternatively, the insulation structure 61 may include polygons having fewer than six vertices, for example three, four or five vertices, or having more than six vertices. Furthermore, the inner light emitting diode element 52 and/or the outer light emitting diode element 50 can have a different shape, for example a polygon having more or fewer than four vertices or a roundish shape, for example an oval or a circle. Furthermore, the inner light emitting diode element 52 and/or the inner electrode segment 53 can have the form of a character, a symbol, a letter, a numeral, and/or an image. Furthermore, a plurality of inner light emitting diode elements 52 can be formed with the aid of which lettering and/or a number can be represented. Furthermore, the outer functional area and/or the inner functional area can serve for absorbing electromagnetic radiation, for example for detecting light or for generating energy, during the operation of the optoelectronic component 1.

Figure 3:
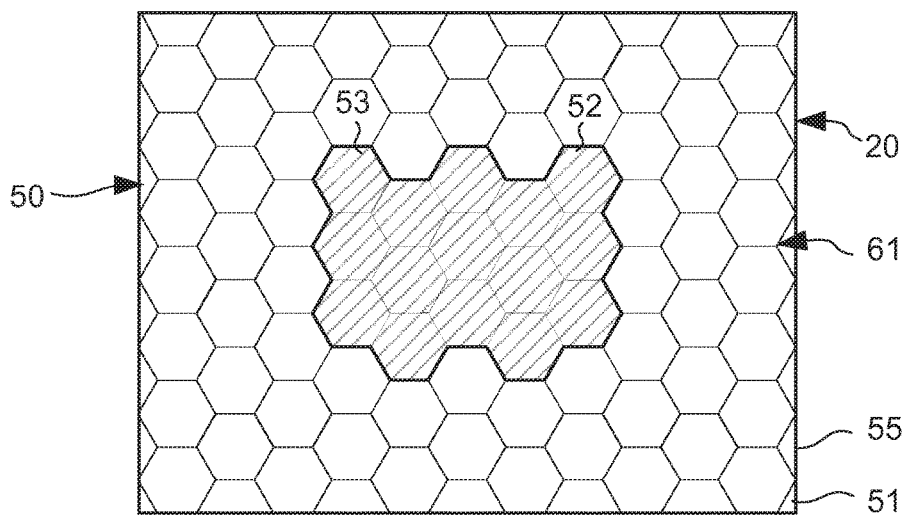
FIG. 3 shows a plan view of an optically active region of one embodiment of an optoelectronic component.

FIG. 3 shows a plan view of an optically active region of one embodiment of an optoelectronic component which is formed for example in a manner largely corresponding to the optoelectronic component 1 explained above. In the optoelectronic component 1, the structure of the inner electrode segment 53 corresponds to the insulation structure 61. In particular, an edge of the inner electrode segment 53 runs along and/or parallel to the insulation structure 61. Consequently, the structure of the inner functional area corresponds to the insulation structure 61.

Figure 4:
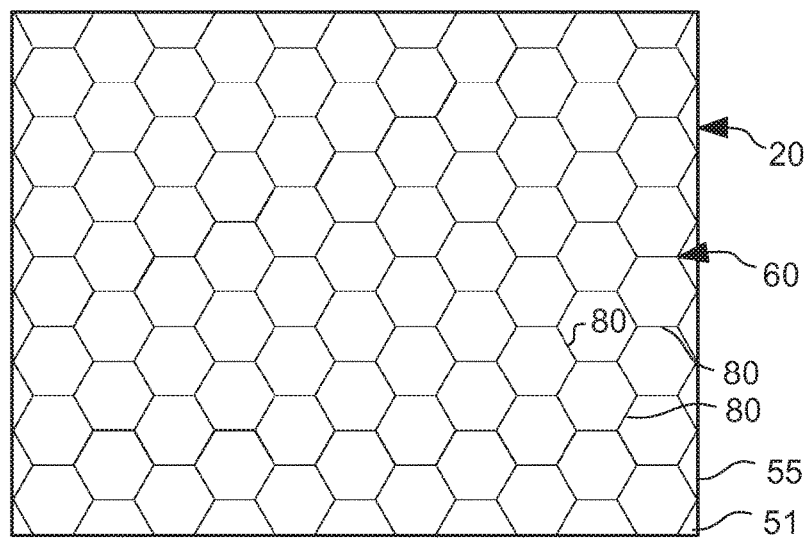
FIG. 4 shows a plan view of an optically active region of one embodiment of an optoelectronic component in a first state during a method for producing the optoelectronic component.

FIG. 4 shows a plan view of an optically active region of one embodiment of an optoelectronic component which for example largely corresponds to the optoelectronic component 1 explained above, during a method for producing the optoelectronic component 1. In particular, FIG. 4 shows a first state of the optoelectronic component 1, in which the first electrode 20 is formed areally and in a non-segmented fashion. The current distribution structure 60 is formed above, in particular on, the first electrode 20. In the first state the current distribution structure 60 forms a continuous network above the first electrode 20. The current distribution structure 60 can also be designated as a hexagonal busbar lattice.

The current distribution structure 60 is formed by a multiplicity of current distribution sections 80. The current distribution sections 80 are rectilinear and form in pairs an angle of 120° in each case. The current distribution sections 80 form a hexagonal lattice having a plurality of regular hexagons. The structure of the current distribution structure 60 is reflected in the insulation structure 61, since the insulation structure 61 covers the current distribution structure 60. The current distribution structure 60 and the insulation structure 61 correspond to one another.

The current distribution sections 80 include or are formed by a metal. The metal may include for example silver, copper, gold and/or aluminum. Alternatively or additionally, the current distribution sections 80 may include or be formed by carbon nanotubes, for example single wall or multiwall carbon nanotubes, and/or an electrically conductive metal oxide, for example indium tin oxide, indium zinc oxide, zinc oxide, and/or nickel oxide. The current distribution structure 60 can be embodied as a metallization of the first electrode 20. The current distribution structure 60 can have a height of 700 nm, for example, perpendicular to the plane of the drawing. The current distribution structure 60 can have a width of . . . , for example, parallel to the plane of the drawing. If appropriate, the insulation structure can have a height of 10 μm perpendicular to the plane of the drawing. The insulation structure can have a width of . . . , for example, parallel to the plane of the drawing.

The insulation structure 61 can subsequently be formed above the current distribution structure 60.

Figure 5:
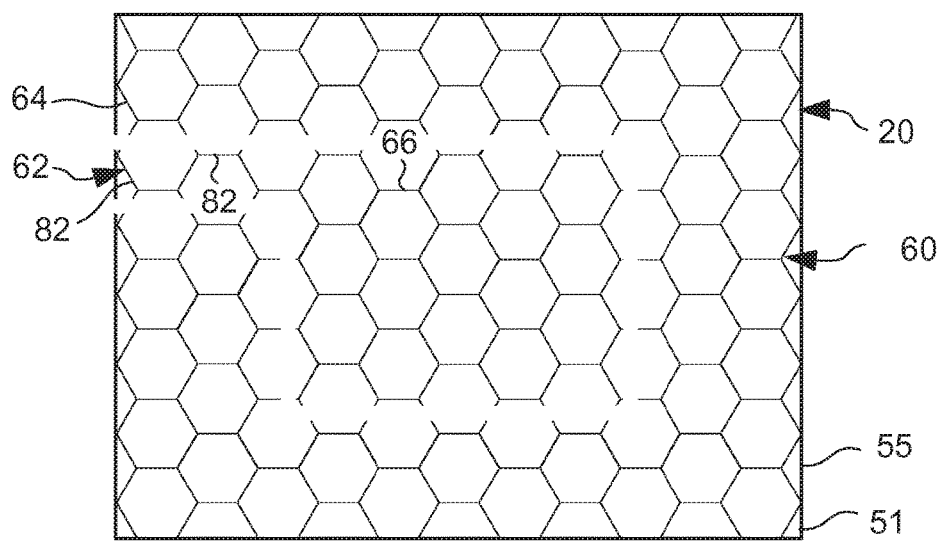
FIG. 5 shows a plan view of the optically active region of the optoelectronic component in accordance with FIG. 4 in a second state during the method for producing the optoelectronic component.

FIG. 5 shows a plan view of the optically active region of the optoelectronic component 1 in accordance with FIG. 4 during the method for producing the optoelectronic component 1, specifically in a second state. In particular, FIG. 5 shows the first electrode 20 with the current distribution structure 60 in accordance with FIG. 4, wherein the current distribution structure 60 and, if appropriate, the insulation structure 61 are severed, for example cut, in places.

The current distribution structure 60 is severed in such a way that a current lead 62, an outer substructure 64 and an inner substructure 66 are formed from the original current distribution structure 60. The inner substructure 66 is formed intrinsically continuously, integrally and, if appropriate, below the insulation structure 61. The outer substructure 64 is formed intrinsically continuously, integrally and, if appropriate, below the insulation structure 61. The current lead 62 is formed intrinsically continuously, integrally and, if appropriate, below the insulation structure 61. The current lead 62 and the inner substructure 66 are formed continuously and integrally. The current lead 62 and the inner substructure 66 are electrically coupled to one another. The current lead 62 and the inner substructure 66 are electrically insulated from the outer substructure 64.

The current lead 62 includes or is formed by a plurality of current lead sections 82. The current lead sections 82 are formed by the current distribution sections 80 originally, that is to say before the severing of the current distribution structure 60, and are designated as current lead sections 82 after the severing. The structure of the current lead 62 corresponds to the current distribution structure 60. In particular, the structure of the current lead 62 is geometrically similar to the current distribution structure 60. In particular, the structure of the current lead 62 can be mathematically mapped onto the current distribution structure 60 by means of rotation, mirroring and/or displacement.

In particular, the current lead sections 82 are formed in a rectilinear fashion and form in pairs an angle of 120° in each case. In particular, the current lead sections 82 are formed parallel to the current distribution sections 80.

If the insulation structure 61 has not yet been formed, it can then be formed above the current distribution structure 60, in particular above the inner substructure 66 and the outer substructure 64, and above the current lead 62.

Figure 6:
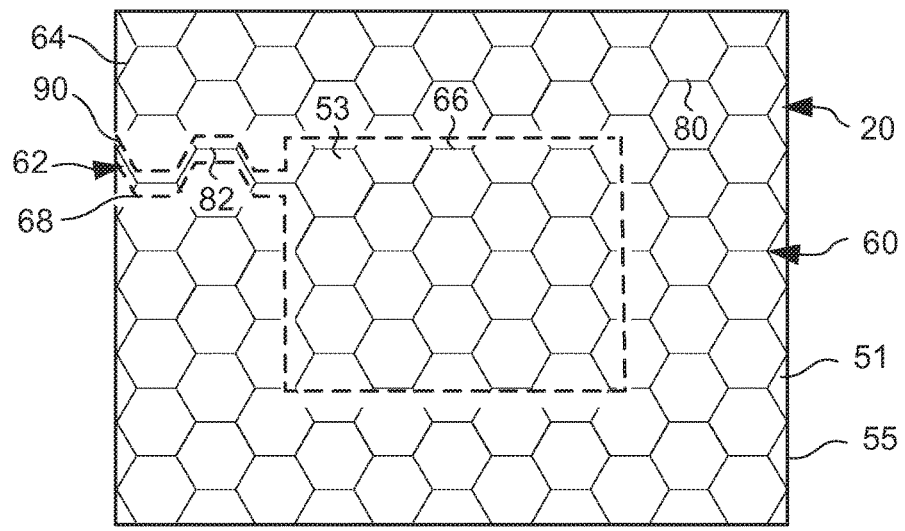
FIG. 6 shows a plan view of the optically active region of the optoelectronic component in a third state during the method for producing the optoelectronic component.

FIG. 6 shows the optically active region of the optoelectronic component 1 in accordance with FIG. 5 in a third state during the method. The first electrode 20 is severed, in particular cut, along the path 90. The structure of the path 90 corresponds, in the region of the current lead 62, to the structure of the current lead 62 and the current distribution structure 60. In particular, the structure of the path 90 in the region of the current lead 62 is geometrically similar to the structure of the current lead 62 and the current distribution structure 60. In particular, the path 90 in the region of the current lead 62 runs laterally alongside, adjacent and parallel to the current lead 62.

The structure of the path 90 between the inner electrode 53 and the outer electrode 51 does not correspond to the structure of the current lead 62 and the current distribution structure 60. In particular, the structure of the path 90 between the inner electrode 53 and the outer electrode 51 is not geometrically similar to the structure of the current lead 62 and the current distribution structure 60. The path 90 between the inner electrode 53 and the outer electrode 51 runs independently of the current distribution structure 60.

The severing of the first electrode 20 can also be designated as segmentation of the first electrode 20. On account of the severing, the outer electrode 51 and the inner electrode 53 are electrically insulated from one another. Moreover, the current lead 62 is electrically insulated from the outer electrode 51. Furthermore, the segmentation defines the structure of the inner functional area and the structure of the outer functional area. The functional areas illustrated in FIG. 2 are produced by means of the structure illustrated in FIG. 6. Optionally, the severing of the first electrode 20 and the severing of the current distribution structure 60 can be carried out in one work pass, that is to say by one cut.

If the insulation structure 61 has not yet been formed, it can then be formed above the current distribution structure 60, in particular above the inner substructure 66 and the outer substructure 64, and above the current lead 62.

Figure 7:
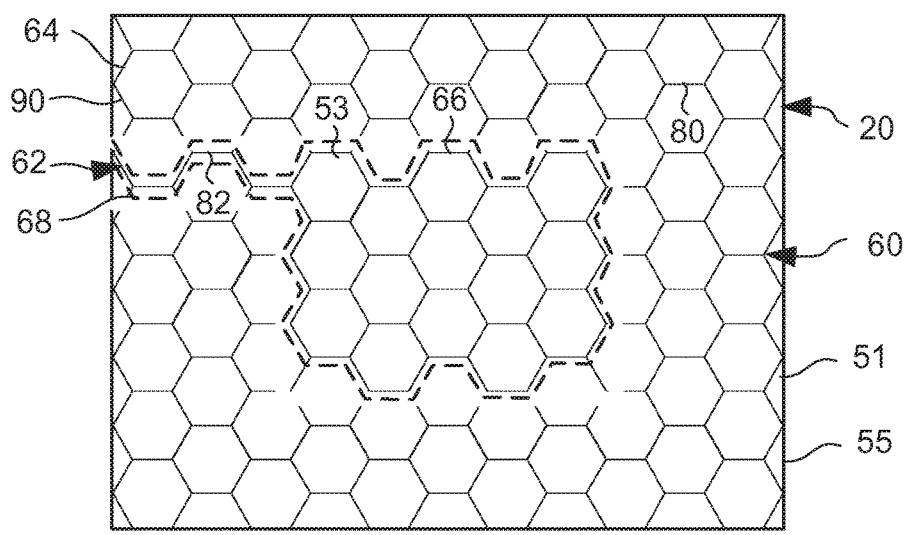
FIG. 7 shows a plan view of the optically active region of the optoelectronic component in an alternative third state during the method for producing the optoelectronic component.

FIG. 7 shows the optically active region of the optoelectronic component 1 in accordance with FIG. 5 in an alternative third state during the method, in which, proceeding from the second state illustrated in FIG. 5, the first electrode 20 is severed along the path 90. The structure of the path 90, in the region of the current lead 62 and between the inner electrode 53 and the outer electrode 51, corresponds to the structure of the current lead 62 and the current distribution structure 60. In particular, the structure of the path 90 in the region of the current lead 62 and between the inner electrode 53 and the outer electrode 51 is geometrically similar to the structure of the current lead 62 and the current distribution structure 60. In particular, the path 90 in the region of the current lead 62 and between the inner electrode 53 and the outer electrode 51 runs laterally alongside, adjacent and parallel to the current lead 62 and the current distribution structure 60, respectively.

The severing of the first electrode 20 can also be designated as segmentation of the first electrode 20. On account of the severing, the outer electrode 51 and the inner electrode 53 are electrically insulated from one another. Moreover, the current lead 62 is electrically insulated from the outer electrode 51. Furthermore, the segmentation defines the structure of the inner functional area and the structure of the outer functional area. The functional areas illustrated in FIG. 3 are produced by means of the structure illustrated in FIG. 7. Optionally, the severing of the first electrode 20 and the severing of the current distribution structure 60 can be carried out in one work pass, that is to say by one cut.

If the insulation structure 61 has not yet been formed, it can then be formed above the current distribution structure 60, in particular above the inner substructure 66 and the outer substructure 64, and above the current lead 62.

In the methods explained above for producing the optoelectronic component 1, the current distribution structure 60 is used for producing the current lead 62 insofar as the current lead 62 is formed by current distribution sections 80 originally belonging to the current distribution structure 60. This automatically has the effect that the structure of the current lead 62 corresponds to the current distribution structure 60. In contrast thereto, in FIGS. 8 to 12 described below, embodiments of the optoelectronic component 1 are described in which the current lead 62 is formed in addition to the current distribution structure 60. In these embodiments, too, the current lead 62 is formed such that the structure of the current lead 62 corresponds to the current distribution structure 60.

The fact that the structure of the current lead 62 corresponds to the current distribution structure 60 means, for example, that the structure of the current lead 62 is geometrically similar to the structure of the current distribution structure 60, that the current lead sections 82 of the current lead 62 are formed adjacent to the current distribution sections 80 of the current distribution structure 60, that the current lead sections 82 are formed parallel to the current distribution sections 80, that the current lead sections 82 are formed laterally alongside or perpendicularly above the current distribution sections 80, that the current lead sections 82 are formed so closely to the current distribution sections 80 that these are not resolvable as individual elements by the user of the optoelectronic component 1 from the outside and/or that they are arranged below an insulation structure section of the insulation structure 61 and/or the current lead 62 is covered by the insulation structure 61 for electrically insulating the current distribution structure 60.

Figure 8:
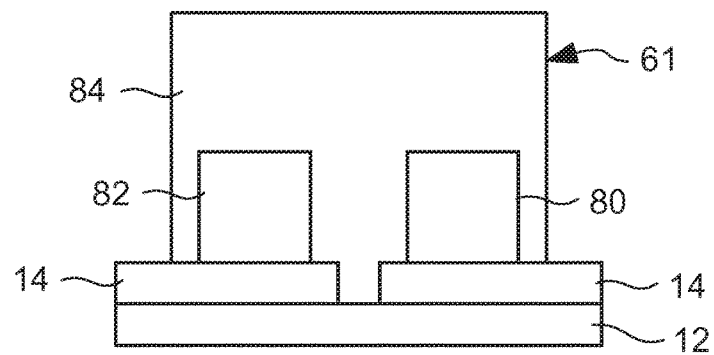
FIG. 8 shows a detailed sectional illustration of one embodiment of a current distribution structure.

FIG. 8 shows a detailed sectional illustration of one embodiment of a current distribution structure 60. The current distribution structure 60 can be formed in plan view for example in accordance with the current distribution structures 60 shown in FIGS. 2, 3 and 4. The current distribution structure 60 includes the current distribution section 80. The current distribution section 80 is covered by an insulation structure section 84. The insulation structure section 84 is part of an insulation structure 61 extending over the entire current distribution structure 60. The current distribution section 80 is formed on the electrode layer 14. The insulation structure section 84 has, perpendicular to the plane of the drawing, a length that is smaller than a width of the insulation structure section 84, said width lying in the plane of the drawing.

The current lead 62 includes a current lead section 82 formed by an electrically conductive material. The current lead section 82 is formed in addition to the current distribution section 80. The current lead section 82 is formed on the electrode layer 14. The current lead section 82 is arranged laterally alongside the current distribution section 80, to be precise adjacent to the latter and so close that they are covered by the same insulation structure section 84. Furthermore, the current lead section 82 and the current distribution section 80 are formed adjacent and parallel to one another. Consequently, the structure of the current lead 62 is formed in a manner corresponding to the current distribution structure 60.

In the completed optoelectronic component 1, only the generally non-transparent insulation structure 61 is discernible from the outside. The insulation structure 61 is formed independently of the current lead 62 for electrically insulating the current distribution structure 60. Therefore, forming the current lead 62 below the same insulation structure 84 as the current distribution structure 60 does not constitute a further optical restriction of the corresponding functional area of the optoelectronic component 1.

Optionally, one, two or more electrical lines, for example current leads, can be arranged alongside one another and below the same insulation structure section 84.

Figure 9:
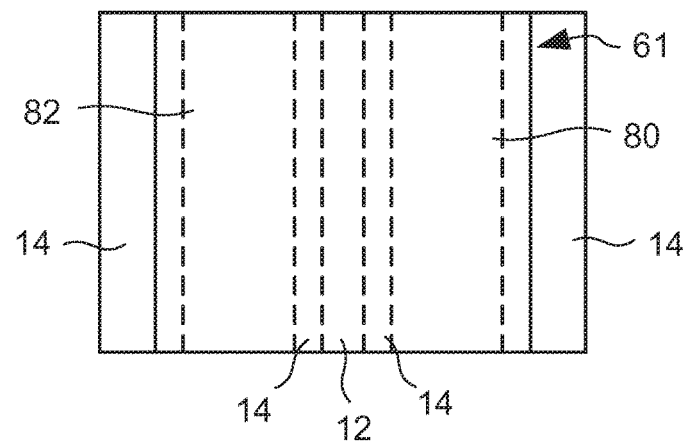
FIG. 9 shows a plan view of the current distribution structure in accordance with FIG. 8.

FIG. 9 shows a plan view of the current distribution structure 60 in accordance with FIG. 8.

The current distribution structure 60 can have a height of 700 nm, for example, perpendicular to the plane of the drawing. The current distribution structure 60 can have a width of . . . , for example, parallel to the plane of the drawing. If appropriate, the insulation structure can have a height of 10 µm perpendicular to the plane of the drawing. The insulation structure 61 can be formed by or include for example a material that is transparent or at least partly transparent, that is to say transparent in a partial wavelength range. The material may include for example photoactive polyimide lacquers, novolac resins and/or epoxy resins.

Figure 10:
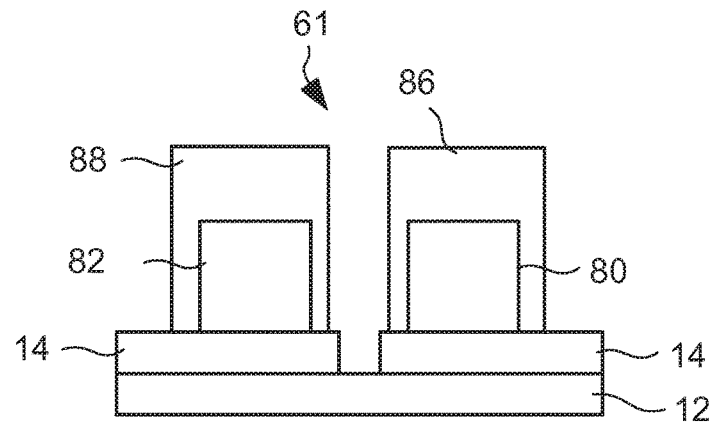
FIG. 10 shows a detailed sectional illustration of one embodiment of a current distribution structure.

FIG. 10 shows a detailed sectional illustration of one embodiment of the current distribution structure 60. The current distribution structure 60 can be formed correspondingly in accordance with the current distribution structures 60 shown in FIGS. 2, 3 and 4, for example, in plan view. The current distribution structure 60 and the current lead 62 are formed in a manner largely corresponding to the current feed and current lead 62 shown in FIG. 8, wherein the current distribution section 80 is covered and electrically insulated by a first insulation structure section 86, and the current lead section 82 is covered and electrically insulated by a second insulation structure section 88. The first and second insulation structure sections 86, 88 are physically separated from one another. However, the first and second insulation structure sections 86, 88 are arranged so close together that they are perceived as an integral structure from the outside by a user of the optoelectronic component 1 and cannot be resolved as separate structures. Furthermore, the current lead section 82 and the current distribution section 80 are formed adjacent and parallel to one another. Consequently, the structure of the current lead 62 is formed in a manner corresponding to the current distribution structure 60.

Optionally, one, two or more electrical lines, for example current leads, can also be arranged alongside one another and below further insulation structure sections.

Figure 11:
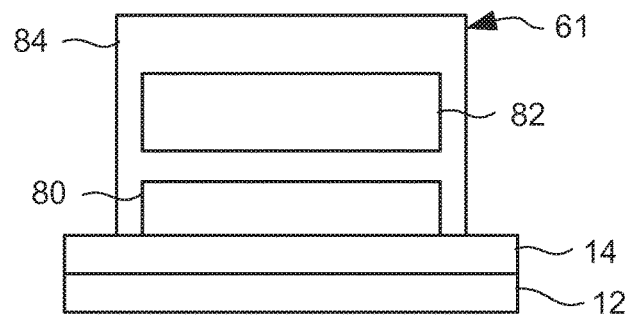
FIG. 11 shows a detailed sectional illustration of one embodiment of a current distribution structure.

FIG. 11 shows a detailed sectional illustration of one embodiment of the current distribution structure 60. The current distribution structure 60 can be formed in accordance with the current distribution structures 60 shown in FIGS. 2, 3 and 4, for example, in plan view. The current distribution structure 60 and the current lead 62 are formed in a manner largely corresponding to the current distribution structure 60 and current lead 62 respectively shown in FIG. 8, wherein the current lead section 82 is formed perpendicularly above the current distribution section 80. Furthermore, the current lead section 82 and the current distribution section 80 are formed adjacent and parallel to one another. Consequently, the structure of the current lead 62 is formed in a manner corresponding to the current distribution structure 60. In a plan view of the optically active region, the current lead 62 is not discernible as an additional structure relative to the current distribution structure 60.

Forming the current lead 62 above the current distribution structure 60 can be carried out by means of printing, for example. By way of example, successively and one above another the current distribution section 80, then the material of the insulation structure section 84 and then the current lead section 82 can be formed by means of printing, for example by means of inkjet printing, screen printing or blade coating.

Optionally, one, two or more electrical lines, for example current leads, can also be arranged one above another and below the same insulation structure section 84.

Figure 12:
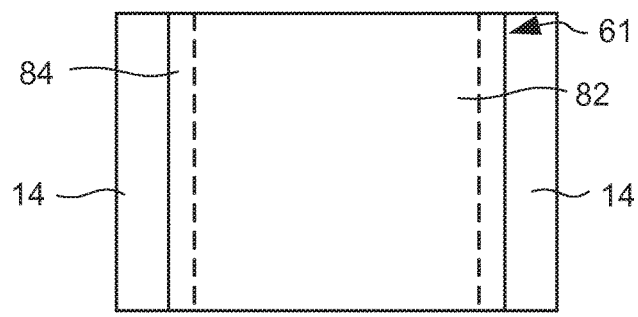
FIG. 12 shows a plan view of the current distribution structure in accordance with FIG. 11.

FIG. 12 shows a plan view of the current distribution structure 60 in accordance with FIG. 11.

The current distribution structure 60 can have a height of 700 nm, for example, perpendicular to the plane of the drawing. The current distribution structure 60 can have a width of . . . , for example, parallel to the plane of the drawing. If appropriate, the insulation structure can have a height of 10 μm perpendicular to the plane of the drawing. The insulation structure 61 can be formed by or include for example a material that is transparent or at least partly transparent, that is to say transparent in a partial wavelength range. The material may include for example photoactive polyimide lacquers, novolac resins and/or epoxy resins.

If it is assumed that the inner functional area includes approximately 10 cm$^2$ and requires a current density of 2.5 mA/cm$^2$, the current lead 62 should be able to transport a current of 25 mA at 6 V without any problems. If a voltage drop of 0.125 volt, for example, is permitted, then a maximum permissible resistance of 4 ohms (R=U/I; 125 V/25 A=5 ohms) results. The resistance of a conductor track can be calculated by means of R=rho*length/cross-sectional area, wherein rho is the resistivity of the conductor track material. For aluminum it holds true that rho_Alu=2.6510*10$^{-2}$ ohms mm$^2$/m.

A current lead 62 which is formed from aluminum and whose current lead sections 82 are formed below the same insulation structure sections 84 as the corresponding current distribution sections 80, having a width of 70 μm, a height of 4.5 μm and a length of 5 cm, has a resistance of 4.2 ohms and enables an energization of inner functional areas, for example inner luminous areas.

A conventional current distribution structure 60, in particular a busbar, has for example a metallization height of 700 nm, and a corresponding insulation structure 61 has a height of approximately 10 μm above the current distribution structure 60. If the height of the insulation structure 61 above the current distribution structure 60 is reduced somewhat by comparison therewith and the metallization of the current distribution structure is made thicker, then it is possible without any problems to accommodate the required conductive structure in the same external dimensions.

A further easing of the situation occurs if the luminous area is energized via a plurality of current leads 62 concealed below the insulation structure 61. If for example four current leads 62 are used instead of one current lead 60 for an inner functional area, the situation is eased significantly. Since this is then a parallel connection of current leads 62, a resistance of 20 ohms can be fixed per current lead 62 in order to achieve overall the allowed 5 ohms. For aluminum this would already be achieved with a height of 1.4 μm and a width of 5 μm. The use of copper (1.678*10$^{-2}$ mm$^2$/m) or silver (1.587*10$^{-2}$ mm$^2$/m) enables the required cross-sectional area to be reduced by a further 60%.

Figure 13:
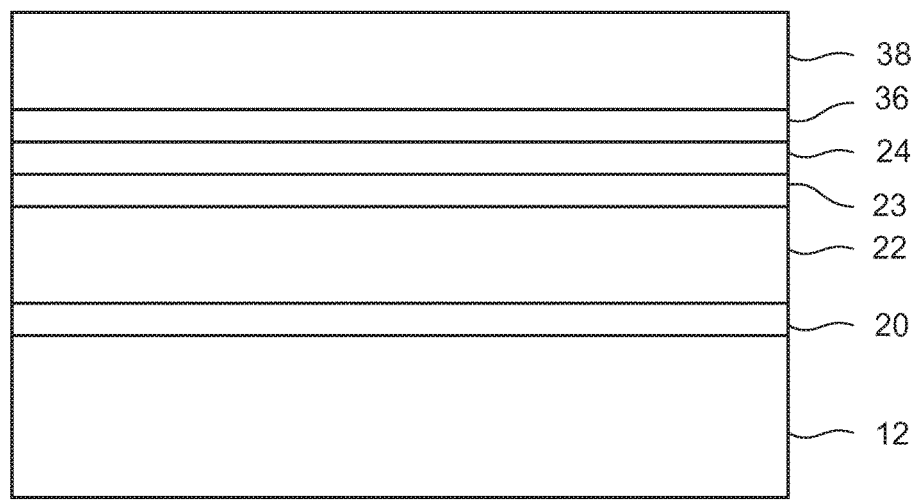
FIG. 13 shows a detailed sectional illustration of one embodiment of an optoelectronic component.

FIG. 13 shows a detailed sectional illustration of a layer structure of one embodiment of an optoelectronic component, for example of the optoelectronic component 1 explained above, for example of one of the light emitting diode elements 50, 52, wherein the current distribution structure 60, the insulation structure 61 and the current lead 62 are not illustrated in FIG. 13. The optoelectronic component 1 can be formed as a top emitter and/or bottom emitter. If the optoelectronic component 1 is formed as a top emitter and bottom emitter, the optoelectronic component 1 can be designated as an optically transparent component, for example a transparent organic light emitting diode.

The optoelectronic component 1 includes the carrier 12 and an active region above the carrier 12. A first barrier layer (not illustrated), for example a first barrier thin-film layer, can be formed between the carrier 12 and the active region. The active region includes the first electrode 20, the organic functional layer structure 22 and the second electrode 23. The encapsulation layer 24 is formed above the active region. The encapsulation layer 24 can be formed as a second barrier layer, for example as a second barrier thin-film layer. The covering body 38 is arranged above the active region and, if appropriate, above the encapsulation layer 24. The covering body 38 can be arranged on the encapsulation layer 24 by means of the adhesion medium layer 36, for example.

The active region is an electrically active region and/or part of the optically active region. The active region is, for example, that region of the optoelectronic component 1 in which electric current for the operation of the optoelectronic component 1 flows and/or in which electromagnetic radiation is generated or absorbed.

The organic functional layer structure 22 may include one, two or more functional layer structure units and one, two or more intermediate layers between the layer structure units.

The carrier 12 can be formed as translucent or transparent. The carrier 12 serves as a carrier element for electronic elements or layers, for example light emitting elements. The carrier 12 may include or be formed from, for example, glass, quartz, and/or a semiconductor material or any other suitable material. Furthermore, the carrier 12 may include or be formed from a plastics film or a laminate including one or including a plurality of plastics films. The plastic may include one or a plurality of polyolefins. Furthermore, the plastic may include polyvinyl chloride (PVC), polystyrene (PS), polyester and/or polycarbonate (PC), polyethylene terephthalate (PET), polyethersulfone (PES) and/or polyethylene naphthalate (PEN). The carrier 12 may include or be formed from a metal, for example copper, silver, gold, platinum, iron, for example a metal compound, for example steel. The carrier 12 can be formed as a metal film or metal-coated film. The carrier 12 can be a part of a mirror structure or form the latter. The carrier 12 can have a mechanically rigid region and/or a mechanically flexible region or be formed in this way.

The first electrode 20 can be formed as an anode or as a cathode. The first electrode 20 can be formed as translucent or transparent. The first electrode 20 includes an electrically conductive material, for example metal and/or a transparent conductive oxide (TCO) or a layer stack of a plurality of layers including metals or TCOs. The first electrode 20 may include for example a layer stack of a combination of a layer of a metal on a layer of a TCO, or vice versa. One example is a silver layer applied on an indium tin oxide (ITO) layer (Ag on ITO) or ITO-Ag-ITO multilayers.

By way of example, Ag, Pt, Au, Mg, Al, Ba, In, Ca, Sm or Li, and compounds, combinations or alloys of these materials can be used as metal.

Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, AlZnO, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs.

The first electrode 20 may include, as an alternative or in addition to the materials mentioned: networks composed of metallic nanowires and nanoparticles, for example composed of Ag, networks composed of carbon nanotubes, graphene particles and graphene layers and/or networks composed of semiconducting nanowires. By way of example, the first electrode 20 may include or be formed from one of the following structures: a network composed of metallic nanowires, for example composed of Ag, which are combined with conductive polymers, a network composed of carbon nanotubes which are combined with conductive polymers, and/or graphene layers and composites. Furthermore, the first electrode 20 may include electrically conductive polymers or transition metal oxides.

The first electrode 20 can have for example a layer thickness in a range of 10 nm to 500 nm, for example of 25 nm to 250 nm, for example of 50 nm to 100 nm.

The first electrode 20 can have a first electrical terminal, to which a first electrical potential can be applied. The first electrical potential can be provided by an energy source (not illustrated), for example by a current source or a voltage source. Alternatively, the first electrical potential can be applied to the carrier 12 and the first electrode 20 can be supplied indirectly via the carrier 12. The first electrical potential can be for example the ground potential or some other predefined reference potential.

The organic functional layer structure 22 may include a hole injection layer, a hole transport layer, an emitter layer, an electron transport layer and/or an electron injection layer.

The hole injection layer can be formed on or above the first electrode 20. The hole injection layer may include or be formed from one or a plurality of the following materials: HAT-CN, Cu(I)pFBz, $MoO_x$, $WO_x$, $VO_x$, $ReO_x$, F4-TCNQ, NDP-2, NDP-9, Bi(III)pFBz, F16CuPc; NPB (N,N'-bis(naphthalen-1-yl)-N,N'-bis(phenyl)benzidine); beta-NPB (N,N'-bis(naphthalen-2-yl)-N,N'-bis(phenyl)benzidine); TPD (N,N'-bis(3-methylphenyl)-N,N'-bis(phenyl)benzidine); spiro-TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD (N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(N,N-diphenylamino)-9,9'-spirobifluorene); 9,9-bis[4-(N,N-bis-biphenyl-4-yl-amino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N,N'-bisphenylamino)phenyl]-9H-fluorene; N,N'-bis(phenanthren-9-yl)-N,N'-bis(phenyl) benzidine; 2,7-bis[N,N-bis(9,9-spirobifluoren-2-yl)amino]-9,9-spirobifluorene; 2,2'-bis[N,N-bis(biphenyl-4-yl)amino]-9,9-spirobifluorene; 2,2'-bis(N,N-diphenylamino)-9,9-spirobifluorene; di[4-(N,N-ditolylamino)phenyl]cyclohexane; 2,2',7,7'-tetra(N,N-ditolyl)aminospirobifluorene; and/or N,N,N',N'-tetranaphthalen-2-ylbenzidine.

The hole injection layer can have a layer thickness in a range of approximately 10 nm to approximately 1000 nm, for example in a range of approximately 30 nm to approximately 300 nm, for example in a range of approximately 50 nm to approximately 200 nm.

The hole transport layer can be formed on or above the hole injection layer. The hole transport layer may include or be formed from one or a plurality of the following materials: NPB (N,N'-bis(naphthalen-1-yl)-N,N'-bis(phenyl)benzidine); beta-NPB (N,N'-bis(naphthalen-2-yl)-N,N'-bis(phenyl)benzidine); TPD (N,N'-bis(3-methylphenyl)-N,N'-bis(phenyl)benzidine); spiro-TPD (N,N'-bis(3-methylphenyl)-N,N'-bis(phenyl)benzidine); spiro-NPB (N,N'-bis(naphthalen-1-yl)-N,N'-bis(phenyl)spiro); DMFL-TPD (N,N'-bis(3-methylphenyl)-N,N'-bis(phenyl)-9,9-dimethylfluorene); DMFL-NPB (N,N'-bis(naphthalen-1-yl)-N,N'-bis(phenyl)-9,9-dimethylfluorene); DPFL-TPD (N,N'-bis(3-methylphenyl)-N,N'-bis(phenyl)-9,9-diphenylfluorene); DPFL-NPB (N,N'-bis(naphthalen-1-yl)-N,N'-bis(phenyl)-9,9-diphenylfluorene); spiro-TAD (2,2',7,7'-tetrakis(N,N-diphenylamino)-9,9'-spirobifluorene); 9,9-bis[4-(N,N-bisbiphenyl-4-yl-amino)phenyl]-9H-fluorene; 9,9-bis[4-(N,N-bisnaphthalen-2-ylamino)phenyl]-9H-fluorene; 9,9-bis[4-(N,N'-bisnaphthalen-2-yl-N,N'-bisphenylamino)phenyl]-9H-fluorene; N,N'-bis(phen-anthren-9-yl)-N,N'-bis(phenyl) benzidine; 2,7-bis[N,N-bis(9,9-spirobifluoren-2-yl)amino]-9,9-spirobifluorene; 2,2'-bis[N,N-bis(biphenyl-4-yl)amino]-9,9-spirobifluorene; 2,2'-bis(N,N-diphenylamino)-9,9-spirobifluorene; di[4-(N,N-ditolyl-amino)phenyl]cyclohexane; 2,2',7,7'-tetra(N,N-ditolyl)amino-spirobifluorene; and N,N,N',N'-tetranaphthalen-2-ylbenzidine.

The hole transport layer can have a layer thickness in a range of approximately 5 nm to approximately 50 nm, for example in a range of approximately 10 nm to approximately 30 nm, for example approximately 20 nm.

One or a plurality of emitter layers, for example including fluorescent and/or phosphorescent emitters, can be formed on or above the hole transport layer. The emitter layer may include organic polymers, organic oligomers, organic monomers, organic small, non-polymeric molecules ("small molecules") or a combination of these materials. The emitter layer may include or be formed from one or a plurality of the following materials: organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl(2-carboxypyridyl) iridium III), green phosphorescent Ir(ppy)3 (tris(2-phenylpyridine)iridium III), red phosphorescent Ru (dtb-bpy)3*2(PF6) (tris[4,4'-di-tert-butyl-(2,2')-bipyridine]ruthenium(III) complex) and blue fluorescent DPAVBi (4,4-bis[4-(di-p-tolyl-amino)styryl]biphenyl), green fluorescent TTPA (9,10-bis[N,N-di(p-tolyl)amino]anthracene) and red fluorescent DCM2 (4-dicyanomethylene)-2-methyl-6-julolidyl-9-enyl-4H-pyran) as non-polymeric emitters. Such non-polymeric emitters can be deposited for example by means of thermal evaporation. Furthermore, polymer emitters can be used which can be deposited for example by means of a wet-chemical method, such as, for example, a spin coating method. The emitter materials can be embedded in a suitable manner in a matrix material, for example a technical ceramic or a polymer, for example an epoxy; or a silicone.

The first emitter layer can have a layer thickness in a range of approximately 5 nm to approximately 50 nm, for example in a range of approximately 10 nm to approximately 30 nm, for example approximately 20 nm.

The emitter layer may include emitter materials that emit in one color or in different colors (for example blue and yellow or blue, green and red). Alternatively, the emitter layer may include a plurality of partial layers which emit light of different colors. By means of mixing the different colors, the emission of light having a white color impression can result. Alternatively or additionally, provision can be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary radiation and secondary radiation.

The electron transport layer can be formed, for example deposited, on or above the emitter layer. The electron transport layer may include or be formed from one or a plurality of the following materials: NET-18; 2,2',2''-(1,3,5-benzinetriyl)tris(1-phenyl-1H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium; 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron transport layer can have a layer thickness in a range of approximately 5 nm to approximately 50 nm, for example in a range of approximately 10 nm to approximately 30 nm, for example approximately 20 nm.

The electron injection layer can be formed on or above the electron transport layer. The electron injection layer may include or be formed from one or a plurality of the following materials: NDN-26, MgAg, $Cs_2CO_3$, $Cs_3PO_4$, Na, Ca, K, Mg, Cs, Li, LiF; 2,2',2''-(1,3,5-benzinetriyl)tris(1-phenyl-1H-benzimidazole); 2-(4-biphenylyl)-5-(4-tert-butylphenyl)-1,3,4-oxadiazole, 2,9-dimethyl-4,7-diphenyl-1,10-phenanthroline (BCP); 8-hydroxyquinolinolato lithium, 4-(naphthalen-1-yl)-3,5-diphenyl-4H-1,2,4-triazole; 1,3-bis[2-(2,2'-bipyridin-6-yl)-1,3,4-oxadiazo-5-yl]benzene; 4,7-diphenyl-1,10-phenanthroline (BPhen); 3-(4-biphenylyl)-4-phenyl-5-tert-butylphenyl-1,2,4-triazole; bis(2-methyl-8-quinolinolate)-4-(phenylphenolato)aluminum; 6,6'-bis[5-(biphenyl-4-yl)-1,3,4-oxadiazo-2-yl]-2,2'-bipyridyl; 2-phenyl-9,10-di(naphthalen-2-yl)anthracene; 2,7-bis[2-(2,2'-bipyridin-6-yl)-1,3,4-oxadiazo-5-yl]-9,9-dimethylfluorene; 1,3-bis[2-(4-tert-butylphenyl)-1,3,4-oxadiazo-5-yl]benzene; 2-(naphthalen-2-yl)-4,7-diphenyl-1,10-phenanthroline; 2,9-bis(naphthalen-2-yl)-4,7-diphenyl-1,10-phenanthroline; tris(2,4,6-trimethyl-3-(pyridin-3-yl)phenyl)borane; 1-methyl-2-(4-(naphthalen-2-yl)phenyl)-1H-imidazo[4,5-f][1,10]phenanthroline; phenyldipyrenylphosphine oxide; naphthalenetetracarboxylic dianhydride or the imides thereof; perylenetetracarboxylic dianhydride or the imides thereof; and substances based on silols including a silacyclopentadiene unit.

The electron injection layer can have a layer thickness in a range of approximately 5 nm to approximately 200 nm, for example in a range of approximately 20 nm to approximately 50 nm, for example approximately 30 nm.

In the case of an organic functional layer structure 22 including two or more organic functional layer structure units, corresponding intermediate layers can be formed between the organic functional layer structure units. The organic functional layer structure units can be formed in each case individually by themselves in accordance with a configuration of the organic functional layer structure 22 explained above. The intermediate layer can be formed as an intermediate electrode. The intermediate electrode can be electrically connected to an external voltage source. The external voltage source can provide a third electrical potential, for example, at the intermediate electrode. However, the intermediate electrode can also have no external electrical terminal, for example by the intermediate electrode having a floating electrical potential.

The organic functional layer structure unit can have for example a layer thickness of a maximum of approximately 3 μm, for example a layer thickness of a maximum of approximately 1 μm, for example a layer thickness of a maximum of approximately 300 nm.

The optoelectronic component 1 can optionally include further functional layers, for example arranged on or above the one or the plurality of emitter layers or on or above the electron transport layer. The further functional layers can be for example internal or external coupling-in/coupling-out structures that can further improve the functionality and thus the efficiency of the optoelectronic component 1.

The second electrode 23 can be formed in accordance with one of the configurations of the first electrode 20, wherein the first electrode 20 and the second electrode 23 can be formed identically or differently. The second electrode 23 can be formed as an anode or as a cathode. The second electrode 23 can have a second electrical terminal, to which a second electrical potential can be applied. The second electrical potential can be provided by the same energy source as, or a different energy source than, the first electrical potential.

The second electrical potential can be different than the first electrical potential. The second electrical potential can have for example a value such that the difference with respect to the first electrical potential has a value in a range of approximately 1.5 V to approximately 20 V, for example a value in a range of approximately 2.5 V to approximately 15 V, for example a value in a range of approximately 3 V to approximately 12 V.

The encapsulation layer 24 can also be designated as thin-film encapsulation. The encapsulation layer 24 can be formed as a translucent or transparent layer. The encapsulation layer 24 forms a barrier against chemical impurities or atmospheric substances, in particular against water (moisture) and oxygen. In other words, the encapsulation layer 24 is formed in such a way that substances that can damage the optoelectronic component, for example water, oxygen or solvent, cannot penetrate through it or at most very small proportions of said substances can penetrate through it. The encapsulation layer 24 can be formed as an individual layer, a layer stack or a layer structure.

The encapsulation layer 24 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenyleneterephthalamide), nylon 66, and mixtures and alloys thereof.

The encapsulation layer 24 can have a layer thickness of approximately 0.1 nm (one atomic layer) to approximately 1000 nm, for example a layer thickness of approximately 10 nm to approximately 100 nm, for example approximately 40 nm. The encapsulation layer 24 may include a high refractive index material, for example one or a plurality of material(s) having a high refractive index, for example having a refractive index of 1.5 to 3, for example of 1.7 to 2.5, for example of 1.8 to 2.

If appropriate, the first barrier layer can be formed on the carrier 12 in a manner corresponding to a configuration of the encapsulation layer 24.

The encapsulation layer 24 can be formed for example by means of a suitable deposition method, e.g. by means of an atomic layer deposition (ALD) method, e.g. a plasma enhanced atomic layer deposition (PEALD) method or a plasmaless atomic layer deposition (PLALD) method, or by means of a chemical vapor deposition (CVD) method, e.g. a plasma enhanced chemical vapor deposition (PECVD) method or a plasmaless chemical vapor deposition (PLCVD) method, or alternatively by means of other suitable deposition methods.

If appropriate, a coupling-in or coupling-out layer can be formed for example as an external film (not illustrated) on the carrier 12 or as an internal coupling-out layer (not illustrated) in the layer cross section of the optoelectronic component 1. The coupling-in/-out layer may include a matrix and scattering centers distributed therein, wherein the average refractive index of the coupling-in/-out layer is greater than the average refractive index of the layer from which the electromagnetic radiation is provided. Furthermore, in addition, one or a plurality of antireflection layers can be formed.

The adhesion medium layer 36 may include adhesive and/or lacquer, for example, by means of which the covering body 38 is arranged, for example adhesively bonded, on the encapsulation layer 24, for example. The adhesion medium layer 36 can be formed as transparent or translucent. The adhesion medium layer 36 may include for example particles which scatter electromagnetic radiation, for example light-scattering particles. As a result, the adhesion medium layer 36 can act as a scattering layer and lead to an improvement in the color angle distortion and the coupling-out efficiency.

The light-scattering particles provided can be dielectric scattering particles, for example composed of a metal oxide, for example silicon oxide ($SiO_2$), zinc oxide (ZnO), zirconium oxide ($ZrO_2$), indium tin oxide (ITO) or indium zinc oxide (IZO), gallium oxide ($Ga_2O_x$), aluminum oxide, or titanium oxide. Other particles may also be suitable provided that they have a refractive index that is different than the effective refractive index of the matrix of the adhesion medium layer 36, for example air bubbles, acrylate, or hollow glass beads. Furthermore, by way of example, metallic nanoparticles, metals such as gold, silver, iron nanoparticles, or the like can be provided as light-scattering particles.

The adhesion medium layer 36 can have a layer thickness of greater than 1 μm, for example a layer thickness of a plurality of μm. In various embodiments, the adhesive can be a lamination adhesive.

The adhesion medium layer 36 can have a refractive index that is less than the refractive index of the covering body 38. The adhesion medium layer 36 may include for example a low refractive index adhesive such as, for example, an acrylate having a refractive index of approximately 1.3. However, the adhesion medium layer 36 can also include a high refractive index adhesive which for example includes high refractive index, non-scattering particles and has a layer-thickness-averaged refractive index that approximately corresponds to the average refractive index of the organic functional layer structure 22, for example in a range of approximately 1.6 to 2.5, for example of 1.7 to approximately 2.0.

A so-called getter layer or getter structure, i.e. a laterally structured getter layer, can be arranged (not illustrated) on or above the active region. The getter layer can be formed as translucent, transparent or opaque. The getter layer may include or be formed from a material that absorbs and binds substances that are harmful to the active region. A getter layer may include or be formed from a zeolite derivative, for example. The getter layer can have a layer thickness of greater than 1 μm, for example a layer thickness of a plurality of μm. In various embodiments, the getter layer may include a lamination adhesive or be embedded in the adhesion medium layer 36.

The covering body 38 can be formed for example by a glass body, a metal film or a sealed plastics film covering body. The covering body 38 can be arranged on the encapsulation layer 24 or the active region for example by means of frit bonding (glass frit bonding/glass soldering/seal glass bonding) by means of a conventional glass solder in the geometrical edge regions of the optoelectronic component 1. The covering body 38 can have for example a refractive index (for example at a wavelength of 633 nm) of for example 1.3 to 3, for example of 1.4 to 2, for example of 1.5 to 1.8.

The present disclosure is not restricted to the embodiments indicated. By way of example, the embodiments shown in FIGS. 8, 10 and 11 can be combined with one another. By way of example, two or more current lead sections 82 and/or current distribution sections 80 can be formed close together, adjacent, laterally alongside, perpendicularly above and/or parallel to one another. By way of example, even further current lead sections 82 can be formed below the same insulation structure section 84 or close together at least in accordance with FIG. 10. This can be utilized for example for realizing two or more inner functional areas, wherein the inner functional areas can be nested laterally alongside one another and/or in one another. By way of example, with mutually different current leads 62 or the corresponding current lead sections 83 it is possible to realize an inner functional area which is completely surrounded by one or a plurality of other inner functional areas in a lateral direction.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component, comprising:
a first electrode comprising at least one outer electrode segment which is formed at a lateral edge of the first electrode, and at least one inner electrode segment which is formed in a manner spaced apart from the lateral edge of the first electrode,
an electrically conductive current distribution structure formed above the first electrode and comprising at least one outer substructure which extends at least over the outer electrode segment, and at least one inner substructure which extends at least over the inner electrode segment and which is electrically insulated from the outer substructure,
at least one current lead which extends from the lateral edge of the first electrode toward the inner substructure, which is electrically coupled to the inner substructure, which is electrically insulated from the outer substructure and which structure corresponds to the current distribution structure,
an insulation structure, which covers the current distribution structure and the current lead,
an organic functional layer structure above the first electrode, the current distribution structure, the current lead and the insulation structure, and a second electrode above the organic functional layer structure.

2. The optoelectronic component as claimed in claim 1, wherein the structure of the current lead is geometrically similar to the current distribution structure.

3. The optoelectronic component as claimed in claim 1, wherein the current distribution structure is formed in an integral fashion and comprises a plurality of rectilinear current distribution sections, and wherein the current lead runs adjacent to the current distribution sections.

4. The optoelectronic component as claimed in claim 3, wherein the current lead runs laterally alongside or perpendicularly above the current distribution sections.

5. The optoelectronic component as claimed in claim 3, wherein the current lead runs parallel to the current distribution sections.

6. The optoelectronic component as claimed in claim 1, wherein the current lead is formed integrally with the inner substructure.

7. The optoelectronic component as claimed in claim 1, wherein the outer electrode segment is formed between the lateral edge of the first electrode and the inner electrode segment.

8. The optoelectronic component as claimed in claim 7, wherein the inner electrode segment is surrounded in a lateral direction by said one outer electrode segment, a further outer electrode segment and/or a plurality of outer electrode segments.

9. The optoelectronic component as claimed in claim 1, wherein a current distribution section of the current distribution structure and a current lead section of the current lead are covered by an integral insulation structure section of the insulation structure.

10. The optoelectronic component as claimed in claim 1, wherein a current distribution section of the current distribution structure is covered by a first insulation structure section of the insulation structure and a current lead section of the current lead is covered by a second insulation structure section of the insulation structure, wherein the first and second insulation structure sections are physically separated from one another.

11. A method for producing an optoelectronic component, wherein
a first electrode is provided, comprising at least one outer electrode segment which is formed at a lateral edge of the first electrode, and at least one inner electrode segment which is formed in a manner spaced apart from the lateral edge of the first electrode,
an electrically conductive current distribution structure is formed above the first electrode, said electrically conductive current distribution structure comprising at least one outer substructure which extends at least over the outer electrode segment, and at least one inner substructure which extends at least over the inner electrode segment and which is electrically insulated from the outer substructure, at least one current lead is formed which extends from the lateral edge of the first electrode toward the inner substructure, which is electrically coupled to the inner substructure, which is electrically insulated from the outer substructure and whose structure corresponds to the current distribution structure,
an insulation structure is formed above the current distribution structure and the current lead,
an organic functional layer structure is formed above the first electrode, the current distribution structure, the current lead and the insulation structure, and a second electrode is formed above the organic functional layer structure.

12. The method as claimed in claim 11, wherein the electrode segments are formed by the first electrode firstly being formed in an integral fashion and then being severed such that the electrode segments are formed.

13. The method as claimed in claim 11, wherein the current distribution structure is formed by the current distribution structure firstly being formed in an integral fashion and then being severed such that the substructures are formed.

14. The method as claimed in claim 11, wherein the current lead is formed by the current distribution structure.

15. The method as claimed in claim 11, wherein the current lead is formed in addition to the current distribution structure.

* * * * *